(12) United States Patent
Chen

(10) Patent No.: US 12,239,021 B2
(45) Date of Patent: Feb. 25, 2025

(54) PIEZOELECTRIC ELEMENT, PIEZOELECTRIC VIBRATOR AND MANUFACTURING METHOD THEREOF, AND ELECTRONIC DEVICE

(71) Applicant: BOE Technology Group Co., Ltd., Beijing (CN)

(72) Inventor: Yuju Chen, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 822 days.

(21) Appl. No.: 17/486,743

(22) Filed: Sep. 27, 2021

(65) Prior Publication Data
US 2022/0158078 A1    May 19, 2022

(30) Foreign Application Priority Data
Nov. 18, 2020   (CN) .......................... 202011300621.3

(51) Int. Cl.
*H01L 41/047* (2006.01)
*H10N 30/05* (2023.01)
*H10N 30/063* (2023.01)
*H10N 30/87* (2023.01)

(52) U.S. Cl.
CPC .......... *H10N 30/063* (2023.02); *H10N 30/05* (2023.02); *H10N 30/874* (2023.02)

(58) Field of Classification Search
CPC .............. H10N 30/874; H10N 30/87
USPC ........................... 310/328, 365, 366
See application file for complete search history.

(56) References Cited

U.S. PATENT DOCUMENTS

| | | | | |
|---|---|---|---|---|
| 7,948,151 B1* | 5/2011 | Blackburn | ........... | H10N 30/101 310/330 |
| 2005/0272183 A1* | 12/2005 | Lukacs | ................. | B06B 1/0622 438/109 |
| 2006/0255693 A1* | 11/2006 | Nishihara | .............. | H03H 9/132 310/365 |
| 2018/0277735 A1* | 9/2018 | Jeong | ..................... | H10N 30/87 |

* cited by examiner

*Primary Examiner* — Derek J Rosenau
(74) *Attorney, Agent, or Firm* — IPro, PLLC

(57) ABSTRACT

The present disclosure provides a piezoelectric element, a piezoelectric vibrator, and a manufacturing method thereof, and an electronic device, and the present disclosure relates to the field of piezoelectric technologies. In the present disclosure, the piezoelectric element is provided with a first electrode and a second electrode positioned on the first electrode. The second electrode is provided with an opening where the first electrode is exposed. A piezoelectric structure is further arranged in the piezoelectric element. The piezoelectric structure includes a first piezoelectric portion and a second piezoelectric portion arranged around the first piezoelectric portion. The first piezoelectric portion is arranged in the opening and is in contact with the first electrode, the second piezoelectric portion is arranged on a side of the second electrode away from the first electrode, and the second piezoelectric portion has orientation.

20 Claims, 4 Drawing Sheets

PIEZOELECTRIC ELEMENT, PIEZOELECTRIC VIBRATOR AND MANUFACTURING METHOD THEREOF, AND ELECTRONIC DEVICE

CROSS REFERENCE TO RELATED APPLICATION

The present application claims the priority of the Chinese patent application filed on Nov. 18, 2020 before the Chinese Patent Office with the application number of 202011300621.3 and the title of "PIEZOELECTRIC ELEMENT, PIEZOELECTRIC VIBRATOR AND MANUFACTURING METHOD THEREOF, AND ELECTRONIC DEVICE", which is incorporated herein in its entirety by reference.

TECHNICAL FIELD

The present disclosure relates to the field of piezoelectric technologies, and more particularly, to a piezoelectric element, a piezoelectric vibrator and a manufacturing method thereof, and an electronic device.

BACKGROUND

With rapid progress of electronic technologies, people have increasingly high requirements on user experience for electronic devices. Most existing electronic devices only may provide visual and auditory experiences and cannot provide tactile experiences to users. In this case, tactile representation technologies emerge.

SUMMARY

The present disclosure provides a piezoelectric element, a piezoelectric vibrator and a manufacturing method thereof and an electronic device.

The present disclosure discloses a piezoelectric element, including a first electrode and a second electrode arranged on the first electrode, wherein the second electrode is provided with an opening where the first electrode is exposed.

The piezoelectric element further comprises a piezoelectric structure, which comprises a first piezoelectric portion and a second piezoelectric portion arranged around the first piezoelectric portion. The first piezoelectric portion is arranged in the opening and is in contact with the first electrode, and the second piezoelectric portion is arranged on a side of the second electrode away from the first electrode, wherein the second piezoelectric portion has orientation.

Optionally, along a direction where the second piezoelectric portion is directed to the first piezoelectric portion, a width of the first piezoelectric portion is 10-20 times that of the second piezoelectric portion.

Optionally, a material of the first electrode is indium tin oxide, and a material of the second electrode is platinum.

Optionally, along a direction perpendicular to a plane where the first electrode is positioned, a thickness of the first electrode ranges from 100 nm to 500 nm, and a thickness of the second electrode is less than 100 nm.

Optionally, along a direction perpendicular to a plane where the first electrode is positioned, a thickness of the first piezoelectric portion is greater than that of the second electrode.

Optionally, along a direction perpendicular to a plane where the first electrode is positioned, sum of the thickness of the second electrode and a thickness of the second piezoelectric portion is equal to the thickness of the first piezoelectric portion.

Optionally, a material of the first piezoelectric portion and a material of the second piezoelectric portion both are piezoelectric ceramics.

Optionally, the piezoelectric element further includes a third electrode arranged on a side of the piezoelectric structure away from the first electrode.

To solve the above problem, the present disclosure also discloses a piezoelectric vibrator, which includes a substrate and the plurality of piezoelectric elements arranged on the substrate.

Optionally, the piezoelectric vibrator further comprises an insulating layer covering the substrate and each of the plurality of piezoelectric elements, and the insulating layer is provided with a first via hole and a second via hole corresponding to each of the plurality of piezoelectric elements.

The piezoelectric vibrator further comprises a wiring layer arranged on a side of the insulating layer away from the piezoelectric element, and the wiring layer comprises a first signal line and a second signal line corresponding to each of the plurality of piezoelectric elements. Each of the plurality of first signal lines is connected to the first electrode in the corresponding piezoelectric element, and each of the plurality of second signal lines is connected to the third electrode in the corresponding piezoelectric element via the second hole.

The present disclosure also discloses manufacturing method of a piezoelectric vibrator, and the method includes:
  forming a plurality of first electrodes on a substrate;
  forming a second electrode on each of the plurality of first electrodes, each of the plurality of second electrodes being provided with an opening where the first electrode is exposed; and
  respectively forming a piezoelectric structure on each of the plurality of first electrodes and the corresponding second electrode.

The piezoelectric structure comprises a first piezoelectric portion and a second piezoelectric portion arranged around the first piezoelectric portion. The first piezoelectric portion is arranged in the opening and is in contact with each of the plurality of first electrodes, and the second piezoelectric portion is arranged on a side of the second electrode away from each of the plurality of first electrodes, wherein the second piezoelectric portion has orientation.

Optionally, after the step of respectively forming a piezoelectric structure on each of the plurality of first electrodes and the corresponding second electrode, the method further comprises:
  forming a third electrode on a side of each of the plurality of piezoelectric structures away from each of the plurality of first electrodes, to obtain a plurality of piezoelectric elements;
  forming an insulating layer covering the substrate and each of the plurality of piezoelectric elements, the insulating layer being provided with a first via hole and a second via hole corresponding to each of the plurality of piezoelectric elements; and
  forming a wiring layer arranged on a side of the insulating layer away from each of the plurality of piezoelectric elements, the wiring layer comprising a first signal line and a second signal line corresponding to each of the plurality of piezoelectric elements, each of the plurality of first signal lines being connected to the first electrode in the corresponding piezoelectric element through the first via hole, and each of the plurality of second signal lines being connected to the third electrode in the corresponding piezoelectric element through the second via hole.

The present disclosure also discloses an electronic device, which includes the above-mentioned piezoelectric vibrator.

BRIEF DESCRIPTION OF THE DRAWINGS

To describe the technical solutions in the embodiments of the present disclosure or in the prior art more clearly, the following briefly introduces the accompanying drawings to be used in the descriptions of the embodiments or the prior art. Obviously, the accompanying drawings in the following description show merely some embodiments of the present disclosure, and a person of ordinary skills in the art may still derive other drawings from these accompanying drawings without creative efforts.

DETAILED DESCRIPTION

To make the foregoing objectives, features, and advantages of the present disclosure more apparent and lucid, the present disclosure is further described in detail below with reference to the accompanying drawings and embodiments.

Figure 1:
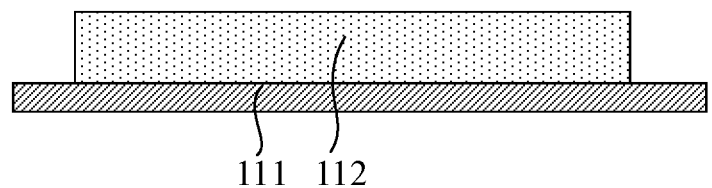
FIG. 1 illustrates a schematic structural diagram of a piezoelectric element in the related technologies.

In the related arts, as shown in FIG. 1, the piezoelectric element includes a first electrode 111 and a piezoelectric structure 112 arranged on the first electrode 111, and the piezoelectric structure 112 does not have orientation. Its specific manufacturing process is as follows: after the first electrode 111 is formed, a piezoelectric film (a film layer corresponding to the piezoelectric structure 112) is formed on the first electrode 111, then the piezoelectric film is annealed, and then the annealed piezoelectric film is patterned to form the piezoelectric structure 112.

However, a material of the first electrode 111 is Indium Tin Oxides (ITO), and thus the piezoelectric film formed on the first electrode 111 does not have orientation, such that a film strength of the piezoelectric film is lower. Therefore, in a process of patterning the piezoelectric film to obtain the piezoelectric structure 112, it is prone to generate a defect in an edge position of the piezoelectric structure 112, such that the defect position is easy to be damaged by vibration in the process of vibrating by means of the piezoelectric element to realize tactile feedback, which may cause failure of the piezoelectric elements.

Therefore, according to the embodiments of the present disclosure, by additionally arranging the second electrode on the first electrode and growing the first piezoelectric portion on the first electrode and growing the second piezoelectric portion on the second electrode, the second piezoelectric portion around the first piezoelectric portion has orientation, and the second piezoelectric portion with orientation has a larger film strength, such that the film strength at an edge of the piezoelectric structure is improved, and a defect in an edge position of the piezoelectric structure is avoided. Therefore, it is avoidable that the defect position may be damaged by vibration when the piezoelectric element is in use, such that reliability of the piezoelectric element may be improved.

Figure 2:
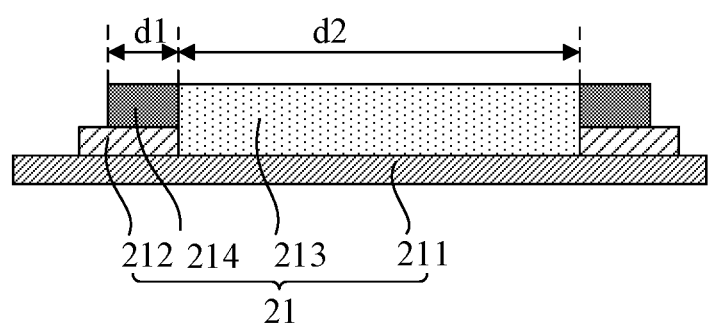
FIG. 2 illustrates a schematic structural diagram of a piezoelectric element according to an embodiment of the present disclosure.

Referring FIG. 2, a schematic structural diagram of a piezoelectric element according to an embodiment of the present disclosure is illustrated.

An embodiment of the present disclosure provides a piezoelectric element 21, which includes a first electrode 211 and a second electrode 212 arranged on the first electrode 211, wherein the second electrode 212 is provided with an opening where the first electrode 211 is exposed. The piezoelectric element 21 includes a piezoelectric structure, which includes a first piezoelectric portion 213 and a second piezoelectric portion 214 arranged around the first piezoelectric portion 213. The first piezoelectric portion 213 is arranged in the opening and is in contact with the first electrode 211, and the second piezoelectric portion 214 is arranged on a side of the second electrode 212 away from the first electrode 211, wherein the second piezoelectric portion 214 has orientation.

In an actual product, the first electrode 211 is a planar electrode, and the second electrode 212 is additionally arranged on the first electrode 211, wherein the second electrode 212 actually is an annular electrode and is provided with an opening where the first electrode 211 is exposed. The first electrode 211 and the second electrode 212 jointly constitute a bottom electrode of the piezoelectric element 21.

Furthermore, the piezoelectric structure is arranged on the first electrode 211 and the second electrode 212. The piezoelectric structure includes a first piezoelectric portion 213 and a second piezoelectric portion 214 arranged around the piezoelectric portion 213, and the first piezoelectric portion 213 and the second piezoelectric portion 214 are of an integrally formed structure.

The first piezoelectric portion 213 is arranged in an opening and is in contact with the first electrode 211. Because the first piezoelectric portion 213 directly grows on the first electrode 211, the first piezoelectric portion 213 does not have orientation, that is, the first piezoelectric portion 213 is a non-oriented structure. The second piezoelectric portion 214 is arranged on a side of the second electrode 212 away from the first electrode 211. The second piezoelectric portion 214 directly grows on the second electrode 212, thus the second piezoelectric portion 214 growing on the second electrode 212 may have orientation by reasonably selecting a material of the second electrode 212. That is, the second piezoelectric portion 214 is an oriented structure.

The oriented structure refers to preferential and sequential arrangement of macromolecular chains, chain segments or microcrystals along a direction of an external field under action of some external fields. The non-oriented structure has a lower film strength, and the oriented structure has a higher film strength. Therefore, the film strength of the second piezoelectric portion 214 is larger than that of the first piezoelectric portion 213.

The second piezoelectric portion 214 is arranged around the first piezoelectric portion 213, and the first piezoelectric portion 213 does not have orientation, but the second piezoelectric portion 214 has orientation. Therefore, the second piezoelectric portion 214 with orientation is arranged at an edge position of the first piezoelectric portion 213 without orientation, such that the film strength at an edge of the piezoelectric structure 21 may be improved, and a defect in the edge position of the piezoelectric structure 21 may be avoided. Thus, in the process of using the piezoelectric element 21, a defect position is prevented from being damaged by vibration, such that the reliability of the piezoelectric element 21 is improved.

It is to be noted that an orthographic projection of the first piezoelectric portion 213 on the first electrode 211 does not overlap with an orthographic projection of the second electrode 212 on the first electrode 211, and an orthographic projection of the second piezoelectric portion 214 on the first electrode 211 is positioned within an orthographic projection of the second electrode 212 on the first electrode 211.

In the embodiment of the present disclosure, a material of the first electrode 211 is ITO, and a material of the second electrode 212 is platinum.

The material of the first electrode 211 is as same as the material adopted in the related technologies (the material is ITO), such that the first piezoelectric structure 213 formed on the ITO does not have orientation. The second electrode 212 is additionally arranged on the first electrode 211 and the material of the second electrode 212 is platinum (Pt), such that the second piezoelectric structure 214 formed on the platinum has orientation.

In the embodiment of the present disclosure, the material of the first piezoelectric portion 213 and the material of the second piezoelectric portion 214 both are piezoelectric ceramics (PZT). For example, the piezoelectric ceramic may be lead zirconate titanate binary system piezoelectric ceramic, which has a chemical formula of $Pb(Zr_{1-x}Ti_x)O_3$, belonging to an $ABO_3$ perovskite structure.

Figure 3:
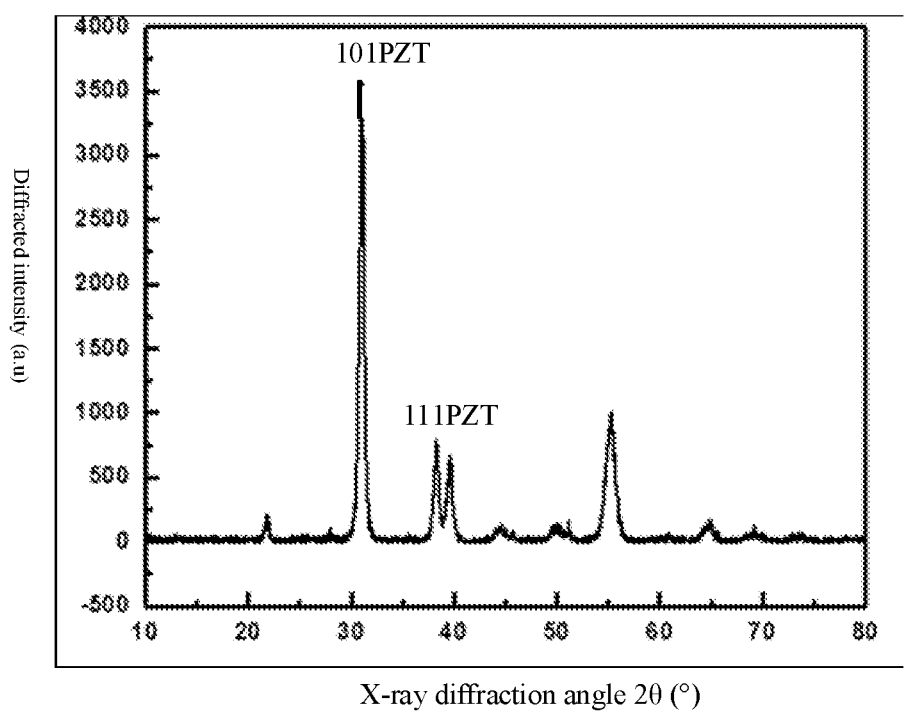
FIG. 3 illustrates an X-ray diffraction (XRD) pattern of a first piezoelectric portion according to an embodiment of the present disclosure.
Figure 4:
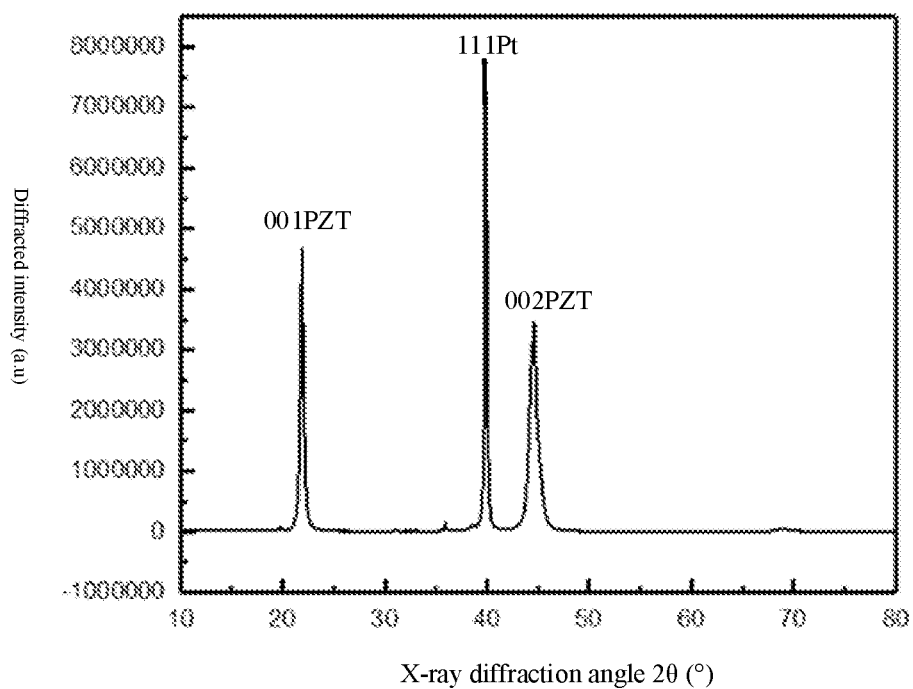
FIG. 4 illustrates an XRD pattern of a second piezoelectric portion according to an embodiment of the present disclosure.

Detected by an experiment, X-ray diffraction (XRD) is carried out on a position corresponding to the first piezoelectric portion 213, such that an XRD pattern as shown in FIG. 3 may be obtained; and X-ray diffraction is carried out on a position corresponding to the second piezoelectric portion 214, such that an XRD pattern as shown in FIG. 4 may be obtained. In FIG. 3 and FIG. 4, its horizontal ordinate is an X-ray diffraction angle 2θ and its vertical coordinate is a diffracted intensity.

As shown in FIG. 3, after X-ray diffraction is carried out on the position corresponding to the first piezoelectric portion 213, two diffraction peaks may be found as below: a diffraction peak pf 101PZT and a diffraction peak of 111PZT respectively. 101PZT refers to the diffraction peak of the first piezoelectric portion 213 along a crystal face (101), and 111PZT refers to the diffraction peak of the first piezoelectric portion 213 along a crystal face (111). By comparing the XRD pattern in a corresponding position of the first piezoelectric portion 213 shown in FIG. 3 with a standard XRD pattern of PZT, it is found that a peak value of each of the diffraction peaks in the XRD pattern shown in FIG. 3 is substantially equal to that of each of the diffraction peaks in the standard XRD pattern of PZT. Therefore, it may be determined that the first piezoelectric portion 213 does not have orientation.

As shown in FIG. 4, after X-ray diffraction is carried out on the position corresponding to the second piezoelectric portion 214, three diffraction peaks may be found as below: a diffraction peak of 001PZT, a diffraction peak of 111Pt, and a diffraction peak of 002PZT respectively. 001PZT refers to the diffraction peak of the second piezoelectric portion 214 along a crystal face (001), 111Pt refers to the diffraction peak of the second electrode 212 along a crystal face (111), and 002PZT refers to the diffraction peak of the second piezoelectric portion 214 along a crystal face (002). By comparing the XRD pattern in a corresponding position of the second piezoelectric portion 214 shown in FIG. 4 with a standard XRD pattern of PZT, it is found that in the XRD pattern as shown in FIG. 4, a peak value of the diffraction peak of 001PZT is greater than that of the corresponding diffraction peak in the standard XRD pattern of PZT. Therefore, preferred orientation of the second piezoelectric portion 214 along the crystal face (001) may be determined.

It is to be noted that X-rays may irradiate to the second electrode 212 under the second piezoelectric portion 214 when X-ray diffraction is carried out on the second piezoelectric portion 214, thus there may be the diffraction peak of the second electrode 212 along the crystal face (111) in FIG. 4.

Further, along a direction where the second piezoelectric portion 214 is directed to the first piezoelectric portion 213, a width d2 of the first piezoelectric portion 213 is 10-20 times of a width d1 of the second piezoelectric portion 214.

In the related arts, the piezoelectric structure is directly formed on the first electrode, and the material of the first electrode is ITO. In an actual manufacturing process, after the piezoelectric film is formed on the first electrode, it is required to carry out high-temperature annealing treatment on the piezoelectric film in an air environment. When the piezoelectric film is subjected to the high-temperature annealing treatment, the whole structure manufactured is placed in a high-temperature environment. At this moment, the first electrode may be annealed at the high temperature, such that a resistance value of the first electrode adopting ITO rises, resulting in unbalance distribution of charges of the first electrode. In this case, the charges may be accumulated on the first electrode, resulting in burnout of the piezoelectric structure as a result of breakdown. According to the embodiments of the present disclosure, the second electrode 212 is additionally arranged on the first electrode 211, the material of the first electrode is ITO, and the material of the second electrode 212 is platinum. Because a conductivity of platinum is greater than that of ITO, the resistance value of the whole bottom electrode (including the first electrode 211 and the second electrode 212) may be reduced by additionally arranging the second electrode 212, a charge distribution region is increased, accumulation of the charges due to unbalanced distribution is reduced, and breakdown of the piezoelectric structure is avoided, and thus the reliability of the piezoelectric element 21 is improved.

Furthermore, because the width d1 of the second piezoelectric portion 214 is substantially equal to the width of the second electrode 212, the width d2 of the first piezoelectric portion 213 is set as 10-20 times of the width d1 of the second piezoelectric portion 214. In this way, the width of the second electrode 212 may be controlled effectively, such that the resistance of the bottom electrode is effectively reduced by means of the second electrode 212, such that breakdown of the piezoelectric structure is further effectively avoided.

In the embodiment of the present disclosure, along a direction perpendicular to a plane where the first electrode 211 is, a thickness of the first electrode 211 ranges from 100 nm to 500 nm, and a thickness of the second electrode 212 is smaller than 100 nm. For example, the thickness of the first electrode 211 may be 200 nm, 300 nm, 400 nm, and so on, and the thickness of the second electrode 212 may be 30 nm, 50 nm, 80 nm, and so on.

By reasonably setting the thickness of the first electrode 211 and the thickness of the second electrode 212, the thickness of the piezoelectric element 21 is decreased while the piezoelectric element 21 may work normally.

In the embodiment of the present disclosure, along a direction perpendicular to a plane where the first electrode 211 is, a thickness of the first piezoelectric portion 213 is greater than a thickness of the second electrode 212.

It is required to arrange a third electrode on a side of the piezoelectric structure away from the first electrode 211 subsequently, that is, a top electrode of the piezoelectric element 21 is arranged on a side of the piezoelectric structure away from the first electrode 211. Therefore, it is required to set the thickness of the first piezoelectric portion 213 to be greater than that of the second electrode 212, such that it is avoidable failure of normal operation of the piezoelectric element 21 due to direct contact between the third electrode and the second electrode 212.

Further, along a direction perpendicular to a plane where the first electrode 211 is, sum of the thickness of the second electrode 212 and the thickness of the second piezoelectric portion 214 is equal to the thickness of the first piezoelectric portion 213.

That is, a surface of a side of the first piezoelectric portion 213 away from the first electrode 211 and a surface of a side of the second piezoelectric portion 214 away from the second electrode 214 are positioned on the same plane. When the third electrode is manufactured subsequently, a surface of a side of the third electrode away from the first electrode 211 is also positioned on the same plane. In this way, flatness of the piezoelectric element 21 is guaranteed.

Figure 5:
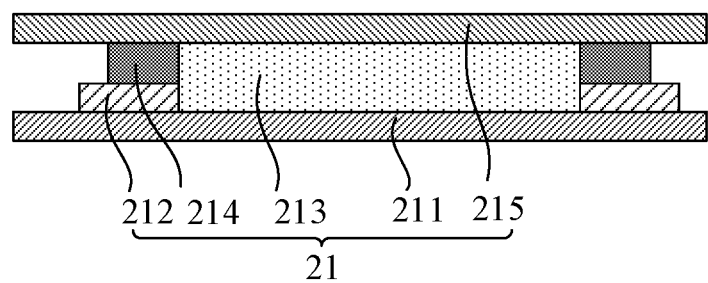
FIG. 5 illustrates a schematic structural diagram of another piezoelectric element according to an embodiment of the present disclosure.

As shown in FIG. 5, the piezoelectric element 21 further includes a third electrode 215 arranged on a side of the piezoelectric structure away from the first electrode 211. The third electrode 215 actually is a top electrode of the piezoelectric element 211, and the third electrode 215 covers the first piezoelectric portion 213 and the second piezoelectric portion 214.

The structure of the third electrode 215 may be as same as that of the first electrode 211, and they are both planar electrodes, and the material of the third electrode 215 may also be ITO. Furthermore, a shape of the first electrode 211 and a shape of the third electrode 215 both are rectangles, and a shape of the second electrode 212 is a rectangular ring.

It is to be noted that according to the embodiment of the present disclosure, the second electrode 212 is additionally arranged at the edge of the first electrode 211, and ITO is used as the material of the first electrode 211 and the material of the third electrode 215, and platinum is used as the material of the second electrode 212. In this way, transmittance of the piezoelectric element 21 may be guaranteed while the resistance of the bottom electrode is reduced and the film strength of the edge of the piezoelectric structure is improved, such that light rays may penetrate through the piezoelectric element 21 normally. Therefore, the piezoelectric element 21 in the embodiment of the present disclosure may be applied to an electronic device where a piezoelectric element requiring higher transmittance is provided.

In the embodiment of the present disclosure, by additionally arranging the second electrode on the first electrode and growing the first piezoelectric portion on the first electrode and growing the second piezoelectric portion on the second electrode, the second piezoelectric portion around the first piezoelectric portion has orientation, and the second piezoelectric portion with orientation has a higher film strength, such that the film strength at an edge of the piezoelectric structure is improved, and a defect in an edge position of the piezoelectric structure is avoided. Therefore, it is avoidable that the defect position may be damaged by vibration when the piezoelectric element is in use, such that reliability of the piezoelectric element may be improved.

Figure 6:
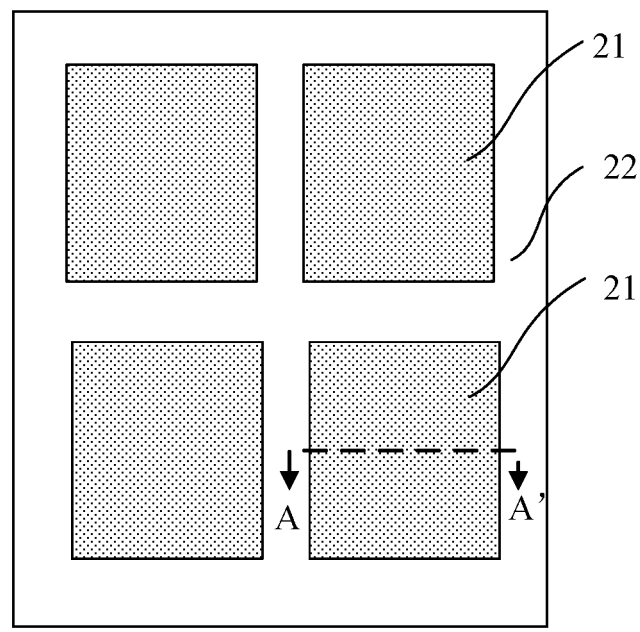
FIG. 6 illustrates a schematic plan diagram of a piezoelectric vibrator according to an embodiment of the present disclosure.
Figure 7:
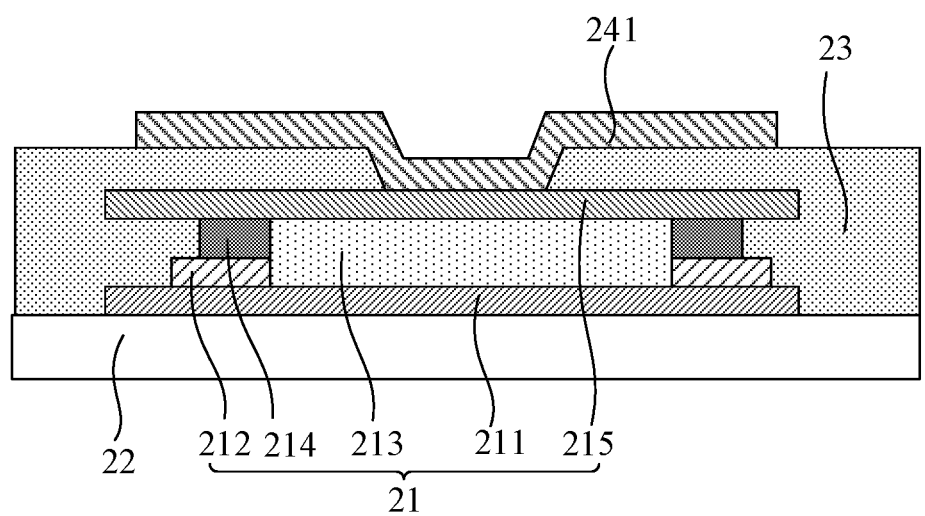
FIG. 7 illustrates a schematic structural diagram of a piezoelectric vibrator according to an embodiment of the present disclosure.

FIG. 6 illustrates a schematic plan diagram of a piezoelectric vibrator according to an embodiment of the present disclosure, and FIG. 7 illustrates a schematic structural diagram of a piezoelectric vibrator according to an embodiment of the present disclosure, and FIG. 7 is a section view of FIG. 6 along a section A-A'.

This embodiment of the present disclosure provides a piezoelectric vibrator, which includes a substrate 22 and the plurality of piezoelectric elements 21 arranged on the substrate 21.

The substrate 22 may be a flexible substrate or a rigid substrate. For example, a material of the flexible substrate may be Polyimide (PI), Polyethylene Terephthalate (PET) or Polydimethylsiloxane (PDMS). The rigid substrate may actually be a glass substrate.

The substrate 22 is provided with the plurality of piezoelectric elements 21. Specifically, the substrate 22 is arranged on a side of the first electrode 211 away from the piezoelectric structure, that is, the substrate 22 is in direct contact with the first electrode 211 in the piezoelectric element 21.

Further, the piezoelectric vibrator also includes an insulating layer 23 covering the substrate 22 and each of the plurality of piezoelectric elements 21, wherein the insulating layer 23 is provided with a first via hole and a second via hole corresponding to each of the plurality of piezoelectric elements 21. The piezoelectric vibrator also includes a wiring layer arranged on a side of the insulating layer 23 away from each of the plurality of piezoelectric elements 21, wherein the wiring layer includes a first signal line (not shown in FIG. 7) and a second signal line 241 corresponding to each of the plurality of piezoelectric elements 21. Each of the plurality of first signal lines is connected to the first electrode 211 in the corresponding piezoelectric element 21 via the first via hole, and each of the plurality of second signal lines 241 is connected to the third electrode 215 in the corresponding piezoelectric element 21 via the second via hole.

A material of the insulating layer 23 is at least one of silicon nitride and silicon oxide, and the insulating layer 23 is provided with a plurality of first via holes and a plurality of second via holes penetrative. Each of the plurality of piezoelectric elements 21 corresponds to one of the plurality of first via holes and one of the plurality of second via holes. The plurality of first via holes may allow the first electrode 211 in the piezoelectric element 21 to be exposed, and the plurality of second via holes may allow the third electrode 215 in the piezoelectric element 21 to be exposed.

The insulating layer 23 is provided with a plurality of first signal lines and a plurality of second signal lines, and each of the plurality of piezoelectric elements 21 corresponds to one of the plurality of first signal lines and one of the plurality of second signal lines. For each of the plurality of piezoelectric elements 21, a first signal line corresponding to this piezoelectric element 21 is connected to the first electrode 211 via the first via hole, to provide a first voltage to the first electrode 211 and the second electrode 212, and a second signal line corresponding to this piezoelectric element 21 is connected to the third electrode 215 via the second via hole, to provide a second voltage to the third electrode 215. Materials of the plurality of first signal lines and the plurality of second signal lines are conducting materials. For example, the materials of the plurality of first signal lines and the plurality of second signal lines are metals or alloys, etc.

In an actual using process, a first voltage signal is inputted to each of the plurality of first signal lines, such that the first voltage is provided to the first electrode 211 and the second electrode 212 in each of the plurality of piezoelectric elements 21. A second voltage signal is inputted to each of the plurality of second signal lines, such that a second voltage is provided to the third electrode 215 in each of the plurality of piezoelectric elements 21. The first voltage is not equal to the second voltage. The piezoelectric structure in the piezoelectric element 21 vibrates under control of the first voltage and the second voltage. That is, the piezoelectric portion 213 and the second piezoelectric portion 214 in each of the plurality of piezoelectric elements 21 vibrate to realize tactile representation.

In the embodiment of the present disclosure, by additionally arranging the second electrode on the first electrode and growing the first piezoelectric portion on the first electrode and growing the second piezoelectric portion on the second electrode, the second piezoelectric portion around the first piezoelectric portion has orientation, and the second piezoelectric portion with orientation has a higher film strength, such that the film strength at an edge of the piezoelectric structure is improved, and a defect in an edge position of the piezoelectric structure is avoided. Therefore, it is avoidable that the defect position may be damaged by vibration when the piezoelectric element is in use, such that reliability of the piezoelectric element may be improved.

Figure 8:
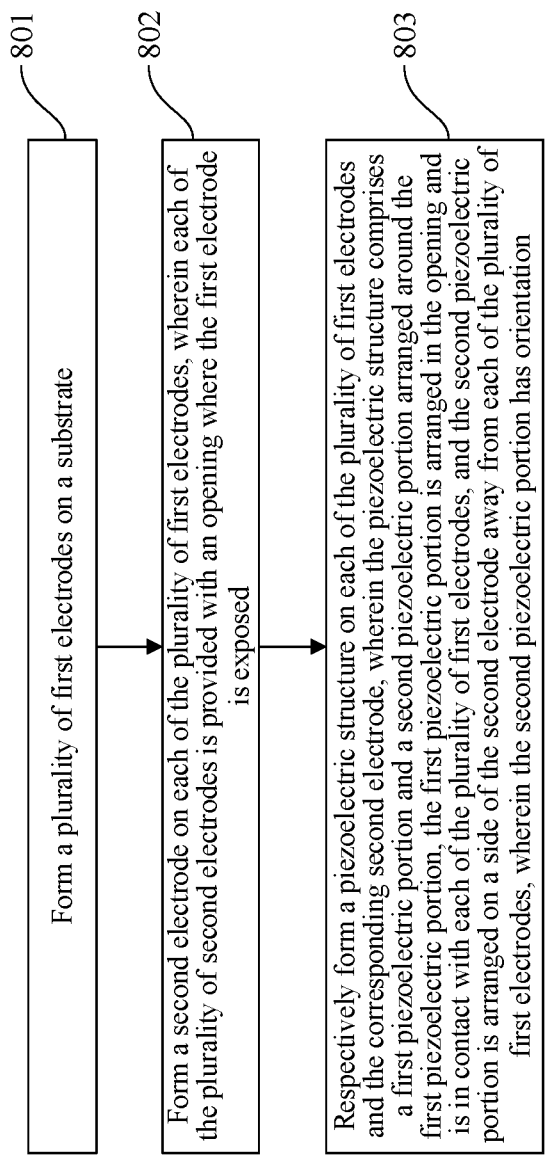
FIG. 8 illustrates a flow diagram of a manufacturing method of a piezoelectric vibrator according to an embodiment of the present disclosure.

Referring to FIG. 8, a flow diagram of a manufacturing method of a piezoelectric vibrator according to an embodiment of the present disclosure is illustrated, and the manufacturing method may specifically include following steps.

Step 801: forming a plurality of first electrodes on a substrate.

In this embodiment of the present disclosure, first, a substrate 22 is provided, which may be a flexible substrate or a rigid substrate. Next, a plurality of first electrodes 211 are formed on the substrate 22 by means of a patterning process.

Specifically, a first electrode film is deposited on the substrate 22 first, and the first electrode film is subjected to high-temperature annealing treatment in a nitrogen environment to reduce a resistivity of the first electrode film. Next, the first electrode film is coated with a photoresist, and the photoresist is subjected to exposure and development. Next, the first electrode film in a region where the photoresist is removed is etched, and the residual photoresist is removed. In this way, the plurality of first electrodes 211 are formed on the substrate 22, wherein the materials of the plurality of first electrodes 211 are ITO.

Step 802: forming a second electrode on each of the plurality of first electrodes, wherein each of the plurality of second electrodes is provided with an opening where the first electrode is exposed.

In this embodiment of the present disclosure, after the first electrode 211 is formed on the substrate 22, a second electrode film is deposited first. Next, the second electrode film is coated with a photoresist, and the photoresist is subjected to exposure and development. Next, the second electrode film in a region where the photoresist is removed is etched, and the residual photoresist is removed. In this way, a second electrode 212 is formed on each of the plurality of first electrodes 211.

A material of the second electrode 212 is platinum, and the second electrode 212 is annular in shape. For example, the shape of the second electrode 212 is a rectangular ring, and the second electrode is provided with an opening where the first electrode 211 is exposed, wherein the opening is positioned in a middle position of the first electrode 211. In this case, the second electrode 212 actually is positioned in an edge position of the first electrode 211.

Step 803: respectively forming a piezoelectric structure on each of the plurality of first electrodes and the corresponding second electrode. The piezoelectric structure comprises a first piezoelectric portion and a second piezoelectric portion arranged around the first piezoelectric portion. The first piezoelectric portion is arranged in the opening and is in contact with each of the plurality of first electrodes, and the second piezoelectric portion is arranged on a side of the second electrode away from each of the plurality of first electrodes, wherein the second piezoelectric portion has orientation.

In this embodiment of the present disclosure, after the second electrode 212 is formed on each of the plurality of first electrodes 211, the piezoelectric structure is formed on each of the plurality of first electrodes 211 and the corresponding second electrode 212.

Specifically, a piezoelectric film is formed first by means of a dry coating method or a Sol-Gel method. Next, a structure where the piezoelectric film is formed is placed in an air environment at 550-650° C. for high-temperature annealing treatment to realize growth of PZT grains, such that a good solid solution phase is formed. Next, the piezoelectric film is coated with a photoresist, and the photoresist is subjected to exposure and development. Next, the piezoelectric film in a region where the photoresist is removed is etched, such that the piezoelectric structure is formed on each of the plurality of first electrodes 211 and the corresponding second electrode 212.

The piezoelectric structure includes a first piezoelectric portion 213 and a second piezoelectric portion 214 arranged around the first piezoelectric portion 213. The first piezoelectric portion 213 is arranged in the opening and is in contact with the first electrode 211, and the second piezoelectric portion 214 is arranged on a side of the second electrode 212 away from the first electrode 211, wherein the second piezoelectric portion 214 has orientation.

That is, the piezoelectric portion 213 without orientation is formed on the first electrode 211 within the opening, and the second piezoelectric portion 214 with orientation is formed on the second electrode 212. The first piezoelectric portion 213 and the second piezoelectric portion 214 are formed simultaneously by means of the same patterning process. Furthermore, the farther the second piezoelectric portion 214 is from the first piezoelectric portion 213, the better orientation the second piezoelectric portion 214 has.

Optionally, after Step 803, the method also includes Step S81, Step S82, and Step S83.

Step S81: forming a third electrode on a side of each of the plurality of piezoelectric structures away from each of the plurality of first electrodes, to obtain a plurality of piezoelectric elements;

Step S82: forming an insulating layer covering the substrate and each of the plurality of piezoelectric elements, the insulating layer being provided with a first via hole and a second via hole corresponding to each of the plurality of piezoelectric elements; and Step S83: forming a wiring layer arranged on a side of the insulating layer away from each of the plurality of piezoelectric elements, the wiring layer comprising a first signal line and a second signal line corresponding to each of the plurality of piezoelectric elements, each of the plurality of first signal lines being connected to the first electrode in the corresponding piezoelectric element through the first via hole, and each of the plurality of second signal lines being connected to the third electrode in the corresponding piezoelectric element through the second via hole.

After the piezoelectric structure is formed on each of the plurality of first electrodes 211 and the corresponding second electrode 212, the third electrode 215 is formed on a side of each of the plurality of piezoelectric structures away from the first electrode 211, to obtain the plurality of piezoelectric elements 21. Specifically, first a third electrode film is deposited. Next, the third electrode film is coated with a photoresist, and the photoresist is subjected to exposure and development. Next, the third electrode film in a region where the photoresist is removed is etched, and the residual photoresist is removed. In this way, the third electrode 215 is formed on a side of each of the plurality of piezoelectric structures away from the first electrode 211.

After the plurality of piezoelectric elements 21 are formed, the insulating layer 23 covering the substrate 22 and each of the plurality of piezoelectric elements 21 is formed, and the insulating layer 23 is provided with the first via hole and the second hole corresponding to each of the plurality of piezoelectric elements 21. Specifically, the insulating layer 23 is deposited first. Next, the insulating layer 23 is coated with a photoresist, and the photoresist is subjected to exposure and development. Next, the insulating layer 23 in a region where the photoresist is removed is etched, and the residual photoresist is removed. In this way, the first via hole and the second via hole that penetrate through the insulating layer 23 are formed.

After the insulating layer 23 covering the substrate 22 and each of the plurality of piezoelectric elements 21 is formed, a wiring layer is formed on the insulating layer 23 by means of a patterning process, wherein the wiring layer includes a first signal line (not shown in FIG. 7) and a second signal line 241 corresponding to each of the plurality of piezoelectric elements 21. Each of the plurality of first signal lines is connected to the first electrode 211 in the corresponding piezoelectric element 21 via the first via hole, to provide a first voltage to the first electrode 211 and the second electrode 212. Each of the plurality of second signal lines 241 is connected to the third electrode 215 in the corresponding piezoelectric element 21 via the second via hole, to provide a second voltage to the third electrode 215.

In addition, after the plurality of piezoelectric elements 21 are formed on the substrate 22, it is also required to polarize the piezoelectric elements 21 to increase a piezoelectric constant of the first piezoelectric portion 213 and a piezoelectric constant the second piezoelectric portion 214, such that the plurality of piezoelectric elements 21 have good piezoelectric characteristics. Detected by an experiment, after each of the plurality of piezoelectric elements 21 is polarized, the piezoelectric constant of the first piezoelectric portion 213 and the piezoelectric constant of the second piezoelectric portion 214 are both greater than $1000 \times 10^{-12}$ m/V.

It is to be noted that the piezoelectric element 21 may be polarized before the insulating layer 23 and the wiring layer are formed. That is, the piezoelectric element 21 is polarized before the Step S82. Furthermore, the piezoelectric element 21 may also be polarized after the insulating layer 23 and the wiring layer are formed. That is, the piezoelectric element 21 is polarized after the Step S82. This embodiment of the present disclosure does not limit specific steps of the polarization treatment.

In this embodiment of the present disclosure, by additionally arranging the second electrode on the first electrode and growing the first piezoelectric portion on the first electrode and growing the second piezoelectric portion on the second electrode, the second piezoelectric portion around the first piezoelectric portion has orientation, and the second piezoelectric portion with orientation has a higher film strength, such that the film strength at an edge of the piezoelectric structure is improved, and a defect in an edge position of the piezoelectric structure is avoided. Therefore, it is avoidable that the defect position may be damaged by vibration when the piezoelectric element is in use, such that reliability of the piezoelectric element may be improved.

The embodiment of the present disclosure further provides an electronic device, including the piezoelectric vibrator.

Reference on specific description about the piezoelectric vibrator may be made to description of the embodiment II and the embodiment III, and no more detailed description is made herein.

In an actual product, the electronic device may be a display apparatus. The display apparatus includes a display panel and the piezoelectric vibrator. The piezoelectric vibrator may be arranged on an outgoing side of the display panel, such that the display apparatus may realize a display function and a tactile representation function simultaneously.

Certainly, the electronic device according to the embodiment of the present disclosure is not limited to the display apparatus, and it may further be any product or part with the tactile representation function.

In this embodiment of the present disclosure, by additionally arranging the second electrode on the first electrode and growing the first piezoelectric portion on the first electrode and growing the second piezoelectric portion on the second electrode, the second piezoelectric portion around the first piezoelectric portion has orientation, and the second piezoelectric portion with orientation has a higher film strength, such that the film strength at an edge of the piezoelectric structure is improved, and a defect in an edge position of the piezoelectric structure is avoided. Therefore, it is avoidable that the defect position may be damaged by vibration when the piezoelectric element is in use, such that reliability of the piezoelectric element may be improved.

For a brief description, the foregoing method embodiments are described as a combination of a series of motions. However, those skilled in the art should know that the present disclosure is not limited by sequences of the motions described. This is because some steps may be performed by using other sequences or be performed simultaneously in accordance with the present disclosure. In addition, those skilled in the art should also learn that the embodiments described in the specification are preferred embodiments, and involved motions and modules are not required for the present disclosure.

The embodiments in the specification are described in a progressive manner. Each embodiment is focused on difference from other embodiments. And cross reference is available for identical or similar parts among different embodiments.

Finally, it should be explained that a relational term (such as a first or a second . . . ) is merely intended to separate one entity or operation from another entity or operation instead of requiring or hinting any practical relation or sequence exists among these entities or operations. Furthermore, terms such as "comprise", "include" or other variants thereof are intended to cover a non-exclusive "comprise" so that a process, a method, a merchandise or a device comprising a series of elements not only includes these elements, but also includes other elements not listed explicitly, or also includes inherent elements of the process, the method, the merchandise or the device. In the case of no more restrictions, elements restricted by a sentence "include a . . . " do not exclude the fact that additional identical elements may exist in a process, a method, a merchandise or a device of these elements.

A piezoelectric element, a piezoelectric vibrator and a manufacturing method thereof, and an electronic device provided by the present disclosure are described in detail above. Elaboration of principles and implementations of the present disclosure is made by using specific examples herein, and the description of the foregoing embodiments is merely intended to assist in understanding the method of the present disclosure and the core concept thereof; also, those of ordinary skill in the art may change, in according with the concept of the present disclosure, a concrete implementation and a scope of application. In conclusion, contents of the specification shall be not interpreted as limiting the present disclosure.

The invention claimed is:

1. A piezoelectric element, comprising a first electrode and a second electrode arranged on the first electrode, the second electrode being provided with an opening where the first electrode is exposed;

the piezoelectric element further comprising a piezoelectric structure, the piezoelectric structure comprising a first piezoelectric portion and a second piezoelectric portion arranged around the first piezoelectric portion, the first piezoelectric portion being arranged in the opening and in contact with the first electrode, and the second piezoelectric portion being arranged on a side of the second electrode away from the first electrode, wherein the second piezoelectric portion has orientation.

2. The piezoelectric element according to claim 1, wherein along a direction where the second piezoelectric portion is directed to the first piezoelectric portion, a width of the first piezoelectric portion being 10-20 times of a width of the second piezoelectric portion.

3. The piezoelectric element according to claim 1, wherein a material of the first electrode is indium tin oxide, a material of the second electrode being platinum.

4. The piezoelectric element according to claim 1, wherein along a direction perpendicular to a plane where the first electrode is positioned, a thickness of the first electrode ranges from 100 nm to 500 nm, a thickness of the second electrode being less than 100 nm.

5. The piezoelectric element according to claim 1, wherein along a direction perpendicular to a plane where the first electrode is positioned, a thickness of the first piezoelectric portion is greater than that of the second electrode.

6. The piezoelectric element according to claim 5, wherein along a direction perpendicular to a plane where the first electrode is positioned, sum of the thickness of the second electrode and a thickness of the second piezoelectric portion is equal to the thickness of the first piezoelectric portion.

7. The piezoelectric element according to claim 1, wherein a material of the first piezoelectric portion and a material of the second piezoelectric portion both are piezoelectric ceramics.

8. The piezoelectric element according to claim 1, wherein the piezoelectric element further comprises a third electrode arranged on a side of the piezoelectric structure away from the first electrode.

9. A piezoelectric vibrator, comprising a substrate and a plurality of piezoelectric elements arranged on the substrate, wherein the piezoelectric element comprising a first electrode and a second electrode arranged on the first electrode, the second electrode being provided with an opening where the first electrode is exposed;

the piezoelectric element further comprising a piezoelectric structure, the piezoelectric structure comprising a first piezoelectric portion and a second piezoelectric portion arranged around the first piezoelectric portion, the first piezoelectric portion being arranged in the opening and in contact with the first electrode, and the second piezoelectric portion being arranged on a side of the second electrode away from the first electrode, wherein the second piezoelectric portion has orientation.

10. The piezoelectric vibrator according to claim 9, wherein along a direction where the second piezoelectric portion is directed to the first piezoelectric portion, a width of the first piezoelectric portion being 10-20 times of a width of the second piezoelectric portion.

11. The piezoelectric vibrator according to claim 9, wherein a material of the first electrode is indium tin oxide, a material of the second electrode being platinum.

12. The piezoelectric vibrator according to claim 9, wherein along a direction perpendicular to a plane where the first electrode is positioned, a thickness of the first electrode ranges from 100 nm to 500 nm, a thickness of the second electrode being less than 100 nm.

13. The piezoelectric vibrator according to claim 9, wherein along a direction perpendicular to a plane where the first electrode is positioned, a thickness of the first piezoelectric portion is greater than that of the second electrode.

14. The piezoelectric vibrator according to claim 13, wherein along a direction perpendicular to a plane where the first electrode is positioned, sum of the thickness of the second electrode and a thickness of the second piezoelectric portion is equal to the thickness of the first piezoelectric portion.

15. The piezoelectric vibrator according to claim 9, wherein a material of the first piezoelectric portion and a material of the second piezoelectric portion both are piezoelectric ceramics.

16. The piezoelectric vibrator according to claim 9, wherein the piezoelectric element further comprises a third electrode arranged on a side of the piezoelectric structure away from the first electrode.

17. The piezoelectric vibrator according to claim 9, wherein the piezoelectric vibrator further comprises an insulating layer covering the substrate and each of the plurality of piezoelectric elements, the insulating layer being provided with a first via hole and a second via hole corresponding to each of the plurality of piezoelectric elements; and the piezoelectric vibrator further comprises a wiring layer arranged on a side of the insulating layer away from the piezoelectric element, the wiring layer comprising a first signal line and a second signal line corresponding to each of the plurality of piezoelectric elements, each of the plurality of first signal lines being connected to the first electrode in the corresponding piezoelectric element, and each of the plurality of second signal lines being connected to the third electrode in the corresponding piezoelectric element via the second hole.

18. An electronic device, comprising the piezoelectric vibrator as claimed in claim 9.

19. A manufacturing method of a piezoelectric vibrator, comprising:

forming a plurality of first electrodes on a substrate;

forming a second electrode on each of the plurality of first electrodes, each of the plurality of second electrodes being provided with an opening where the first electrode is exposed; and respectively forming a piezoelectric structure on each of the plurality of first electrodes and the corresponding second electrode;

wherein the piezoelectric structure comprises a first piezoelectric portion and a second piezoelectric portion arranged around the first piezoelectric portion, the first piezoelectric portion being arranged in the opening and in contact with each of the plurality of first electrodes, and the second piezoelectric portion being arranged on a side of the second electrode away from each of the plurality of first electrodes; and the second piezoelectric portion having orientation.

20. The method according to claim 19, wherein after respectively forming a piezoelectric structure on each of the plurality of first electrodes and the corresponding second electrode, the method further comprises:

forming a third electrode on a side of each of the plurality of piezoelectric structures away from each of the plurality of first electrodes, to obtain a plurality of piezoelectric elements;

forming an insulating layer covering the substrate and each of the plurality of piezoelectric elements, the insulating layer being provided with a first via hole and a second via hole corresponding to each of the plurality of piezoelectric elements; and forming a wiring layer arranged on a side of the insulating layer away from each of the plurality of piezoelectric elements, the wiring layer comprising a first signal line and a second signal line corresponding to each of the plurality of piezoelectric elements, each of the plurality of first signal lines being connected to the first electrode in the corresponding piezoelectric element through the first via hole, and each of the plurality of second signal lines being connected to the third electrode in the corresponding piezoelectric element through the second via hole.

* * * * *